(12) United States Patent
Patel et al.

(10) Patent No.: US 12,384,672 B2
(45) Date of Patent: Aug. 12, 2025

(54) MICRO-ELECTRO-MECHANICAL SYSTEM AND ELECTRO-ACOUSTIC CONVERSION DEVICE HAVING THE MICRO-ELECTRO-MECHANICAL SYSTEM

(71) Applicant: AAC ACOUSTIC TECHNOLOGIES (SHENZHEN) CO., LTD., Shenzhen (CN)

(72) Inventors: Anup Hasmukh Patel, Eb (GB); Euan James Boyd, Eb (GB); Scott Lyall Cargill, Eb (GB)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 505 days.

(21) Appl. No.: 17/561,736

(22) Filed: Dec. 24, 2021

(65) Prior Publication Data
US 2023/0202834 A1    Jun. 29, 2023

(51) Int. Cl.
*B81B 3/00*    (2006.01)
*B81B 7/02*    (2006.01)

(52) U.S. Cl.
CPC .............. *B81B 7/02* (2013.01); *B81B 3/0078* (2013.01); *B81B 2201/0257* (2013.01); *B81B 2203/0127* (2013.01)

(58) Field of Classification Search
CPC . B81B 7/02; B81B 3/0078; B81B 2201/0257; B81B 2203/0127; B81B 3/0072; B81B 3/0086; B81B 2201/0264; B81B 3/007; H04R 19/00; H04R 19/005
See application file for complete search history.

(56) References Cited

U.S. PATENT DOCUMENTS

| | | | |
|---|---|---|---|
| 2018/0091906 A1* | 3/2018 | Khenkin | ................ H04R 19/04 |
| 2018/0234774 A1* | 8/2018 | Walther | ............... H04R 19/005 |
| 2019/0071305 A1* | 3/2019 | Strasser | .................... B81B 7/02 |
| 2022/0306455 A1* | 9/2022 | Boyd | ....................... H04R 7/14 |

* cited by examiner

*Primary Examiner* — Steven B Gauthier
*Assistant Examiner* — Sun Mi Kim King
(74) *Attorney, Agent, or Firm* — Wiersch Law Group

(57) ABSTRACT

Provided is a micro-electro-mechanical system and an electro-acoustic conversion device having the micro-electro-mechanical system. The micro-electro-mechanical system includes: first and second membranes arranged opposite to each other; support members arranged between the first and second membranes; and an opening provided on the first and/or second membranes. Each support member includes support walls, and opposite ends of each of the support walls are connected to the first and second membranes. The first and second membranes, and two adjacent support walls in one support member are enclosed to form a first chamber. The opening is configured to link the first chamber with the outside. By arranging a supporting member composed of support walls and providing an opening on the first and/or second membranes, the compliance of the first or second membrane is increased, and the inter-plate capacitance therebetween is reduced.

8 Claims, 13 Drawing Sheets

MICRO-ELECTRO-MECHANICAL SYSTEM AND ELECTRO-ACOUSTIC CONVERSION DEVICE HAVING THE MICRO-ELECTRO-MECHANICAL SYSTEM

TECHNICAL FIELD

The present disclosure relates to the technical field of electro-acoustic conversion devices, and in particular, to a micro-electro-mechanical system and an electro-acoustic conversion device having the micro-electro-mechanical system.

BACKGROUND

The existing micro-electro-mechanical system with a double membrane structure includes an upper membrane, a lower membrane, and several support members for connecting the upper membrane and the lower membrane. The support members allow the upper membrane and the lower membrane to be connected at their closest positions.

In some designs, mechanical compliance of the double membrane structure needs to be adjusted. When under pressure, the double membrane structure will deform, resulting in bending strain applied on a cross section of the support member. The more rigid the area is, the lower the compliance of the entire double membrane structure. The stronger the compliance of this area against bending, the higher the compliance of the entire double membrane structure, and thus the higher the sensitivity of the microphone.

The present disclosure relates to the support member and mainly aiming at improving its compliance, so that the double membrane structure can have higher compliance without changing other design or material parameters.

SUMMARY

In response to the above problems, the present disclosure provides a micro-electro-mechanical system and an electro-acoustic conversion device having the micro-electro-mechanical system to solve the technical problems in the prior art, which can improve the compliance of the double membrane structure.

In a first aspect, the present disclosure provides a micro-electro-mechanical system, including: a first membrane; a second membrane arranged opposite to the first membrane; a plurality of support members arranged between the first membrane and the second membrane, and an opening provided on the first membrane or provided on both the first membrane and the second membrane. Each support member of the plurality of support members includes a plurality of support walls, and opposite ends of each of the plurality of support walls are respectively connected to the first membrane and the second membrane. The first membrane, the second membrane, and two adjacent support walls in one support member are enclosed to form a first chamber. The opening is configured to link the first chamber with the outside.

In embodiments of the present disclosure, a supporting body composed of a plurality of support walls is provided and an opening is provided on both the first membrane or on the first membrane and the second membrane, thereby the compliance of the first membrane or the second membrane is increased, and the inter-plate capacitance between the first membrane and the second membrane is reduced.

As an improvement, the opening includes a slit-shaped hole structure, a circular hole structure, an approximate rectangular hole structure, a Chevron hole structure, or an S-shaped hole structure.

As an improvement, each of the plurality of support members is provided with a plurality of openings, and the plurality of the openings are arranged at intervals along a first direction.

As an improvement, the opening penetrates through the first membrane, and a partial area in the first chamber has a filler material.

As an improvement, each of the plurality of support members includes a plurality of first chambers. Among two adjacent first chambers of the plurality of first chambers, the opening of one of the two adjacent first chambers is provided on the first membrane, and the opening of the other one of the two adjacent first chambers is provided on the second membrane.

As an improvement, the first membrane includes a plurality of first protrusions and a plurality of first recesses alternately arranged along a second direction, and the second membrane includes a plurality of second recess and a plurality of second protrusions alternately arranged in the second direction, each of the plurality of first protrusions is opposite to one of the plurality of second protrusions. One first protrusion, one second protrusion and corresponding two adjacent support walls together form a second chamber. A counter electrode is arranged in the second chamber.

As an improvement, the support member is sandwiched between the first recess and the second recess.

As an improvement, the filler material includes silicon oxide.

As an improvement, the support wall is made of polysilicon or silicon nitride.

In a second aspect, the present disclosure also provides an electro-acoustic conversion device, including the aforementioned micro-electro-mechanical system and a circuit device electrically connected to the micro-electro-mechanical system.

The above description is only an overview of the technical solution of the present disclosure. In order to understand the technical means of the present disclosure more clearly, it can be implemented in accordance with the content of the specification, and in order to make the above and other purposes, features and advantages of the present disclosure more obvious and understandable. The following specifically cite the specific implementation of the present disclosure.

BRIEF DESCRIPTION OF DRAWINGS

Through reading the detailed description of the following embodiments, various other advantages and benefits will become clear to those of ordinary skill in the art. The drawings are only used for the purpose of illustrating the preferred embodiments, and are not considered as limitations to the present disclosure. In all the drawings, the same reference signs are used to denote same components.

Figure 1:
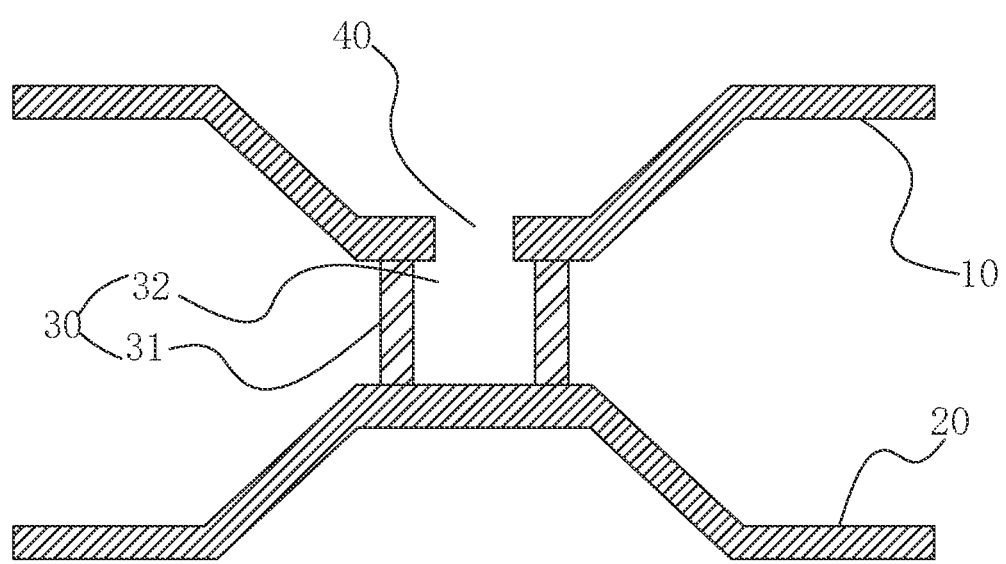
FIG. 1 is a schematic structural diagram of an opening according to a first embodiment.

In the drawings, the drawings may not be drawn to actual scale.

The reference signs in the specific implementation are as follows:

10—first membrane, 11—first protrusion, 12—first recess;
20—second membrane, 21—second recess, 22—second protrusion;
30—support member, 31—support wall, 32—first chamber, 33—second chamber;
40—opening;
50—filler material;
60—counter electrode, 61—conductive element;
70—spoke;
100—electro-acoustic conversion device;
200—micro electro mechanical system;
300—circuit device.

DESCRIPTION OF EMBODIMENTS

Embodiments described below with reference to the drawings are exemplary, and are only used to explain the present disclosure, and cannot be construed as limiting the present disclosure.

Referring to FIG. 1, the present disclosure provides a micro-electro-mechanical system 200, which includes a first membrane 10, a second membrane 20, a support member 30, and an opening 40.

The first membrane 10 is arranged opposite to the second membrane 20, and the first membrane 10 is located above the second membrane 20. In this embodiment, the first membrane 10 and the second membrane 20 are both concentrically arranged circular structures. For the circular structure, a circumferential direction of the circular structure is set as a first direction, and a radial direction of the circular structure is set as a second direction.

A cavity is formed between the first membrane 10 and the second membrane 20. The support member 30 and the counter electrode 60 mentioned later are both located in this cavity. The first membrane 10 and the second membrane 20 can both be made of conductive materials, or both include an insulating film having a conductive element provided thereon.

A support member 30 is disposed in the first membrane 10 and second membrane 20 within the cavity. A plurality of support members 30 may be provided. The plurality of support members 30 are spaced along the second direction and include a plurality of support walls 31 extending along the first direction. The support wall 31 is respectively connected to the first membrane 10 and second membrane 20 at opposite ends, to mechanical couple the first membrane 10 and second membrane 20. The support wall 31 is optionally made of silicon nitride.

The first membrane 10, the second membrane 20 and the two adjacent support walls 31 in the same support member 30 form a first chamber 32. The first chamber 3 can be filled with a filler material 50, and the filler material 50 can be an oxide, such as silicon oxide. Alternatively, the interior of the first chamber 32 may be empty.

The opening 40 penetrates the first membrane 10 and/or the second membrane 20 corresponding to the support member 30 and is used to link the first chamber 32 with the outside. The opening 40 may be provided only on the first membrane 10 or provided on both the first membrane 10 and the second membrane 20. By providing the opening 40, air or etching solution from the external environment is allowed to enter the first chamber 32 to release the filler material 50, thereby increasing the compliance of the first membrane 10 or the second membrane 20, and reducing the inter-plate capacitance between the first membrane 10 and the second membrane 20.

Continuing to refer to FIG. 1, FIG. 1 is a schematic structural diagram of an opening according to a first embodiment, which shows a situation where the opening 40 is only provided on the first membrane 10, and the second membrane 20 is not provided with the opening 40. The amount of increase in the compliance of the first membrane 10 depends on the size and shape of the opening 40. The larger the opening 40, the better compliance the first membrane 10 has. The support member 30 is allowed to stretch in width after releasing of the filler material, thereby reducing a spacing between the two adjacent support members 30 in the second direction, to reduce the instrinsic stress in the first membrane 10 and increase the compliance of the entire double membrane structure.

Figure 4:
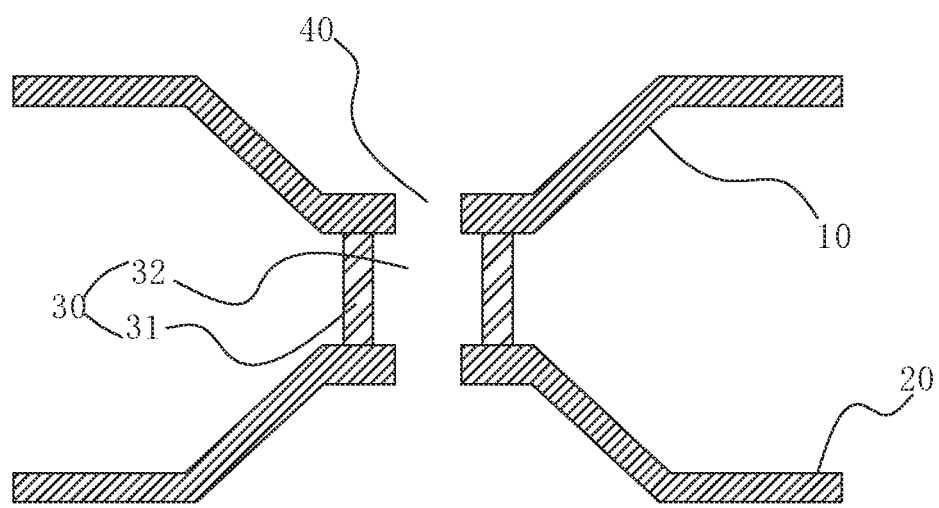
FIG. 4 is a schematic structural diagram of an opening according to a second embodiment.

Referring to FIG. 4, FIG. 4 is a schematic structural diagram of a second opening, which illustrates a situation that both a first membrane 10 and second membrane 20 is provided with an opening 40. The opening 40 completely releases the filler material 50 filled in the first chamber 32, which is equivalent to creating a vent penetrating between the first membrane 10 and the second membrane 20, which can significantly increase compliance of the membrane against bending in the area where the opening 40 is located. The openings 40 on the first membrane 10 and the second membrane 20 may have the same or different size and shape, which is not limited here. In some embodiments, the opening 40 on the first membrane 10 is relatively large, almost extending to the edge of the support wall 31, while the opening 40 on the second membrane 20 is much smaller. In some other embodiments, the opening 40 on the second membrane 20 is relatively large, while the opening 40 on the first membrane 10 is relatively small.

Referring to FIGS. 5 to 9, in some embodiments, the opening 40 includes a slit-shaped hole structure, a circular hole structure, an approximate rectangular hole structure, a Chevron hole structure, or an S-shaped hole structure. The opening 40 can be made large enough to allow the filler material 50 to be fully released while improving the compliance. The size and shape of the opening 40 are selected to increase the compliance of the support member 30, relieve the membrane intrinsic stress and reduce the mechanical stress concentration near the openings on the first membrane 10 or the two membranes 20. Those skilled in the art can understand that the structure of the opening 40 can be implemented in more variants, and it can be a regular pattern or an irregular pattern, which is not limited herein.

Figure 5:
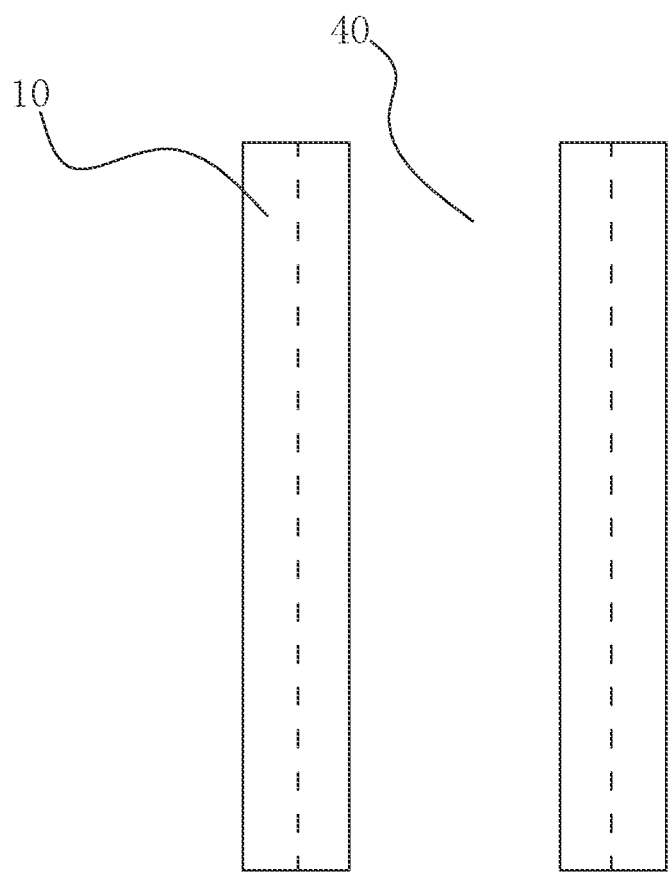
FIG. 5 is a planar view of an opening according to a third embodiment.
Figure 6:
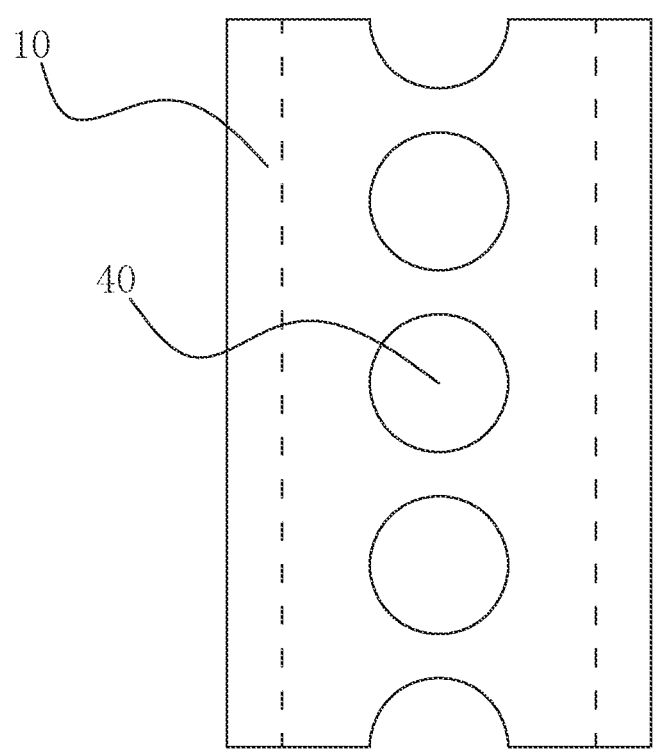
FIG. 6 is a planar view of an opening according to a fourth embodiment.

Referring to FIG. 5, FIG. 5 is a planar view of an opening according to a third embodiment. The opening 40 is a slit-shaped hole structure, and the slit-shaped hole structure penetrates through the first membrane 10 corresponding to the support member 30, and extend along the first direction.

In an embodiment, multiple slit-shaped hole structures can be arranged corresponding to each support member 30, and the multiple slit-shaped holes are arranged at intervals along the first direction. The first membrane 10 is located in the area corresponding to this support member 30 and is kept locally connected.

In another embodiment, only one slit-shaped hole structure is provided corresponding to each support member 30. As shown in FIG. 5, the slit-shaped hole structure penetrates through the first membrane 10, and extends along the circumferential direction of the first membrane 10, completely breaking the mechanical connection in the area of the first membrane 10 corresponding to the support member 30, thereby obtaining the highest compliance.

Figure 7:
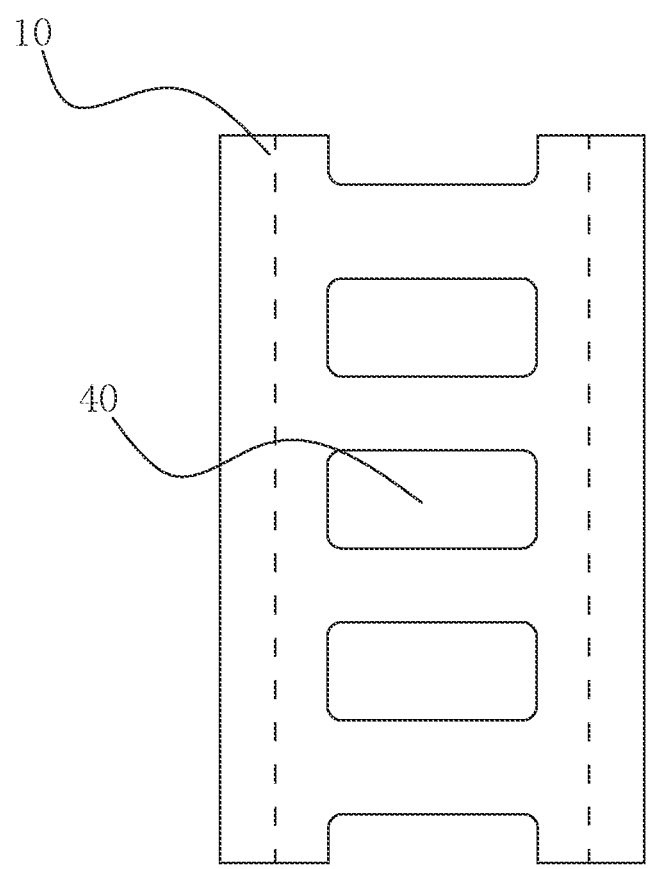
FIG. 7 is a planar view of an opening according to a fifth embodiment.
Figure 8:
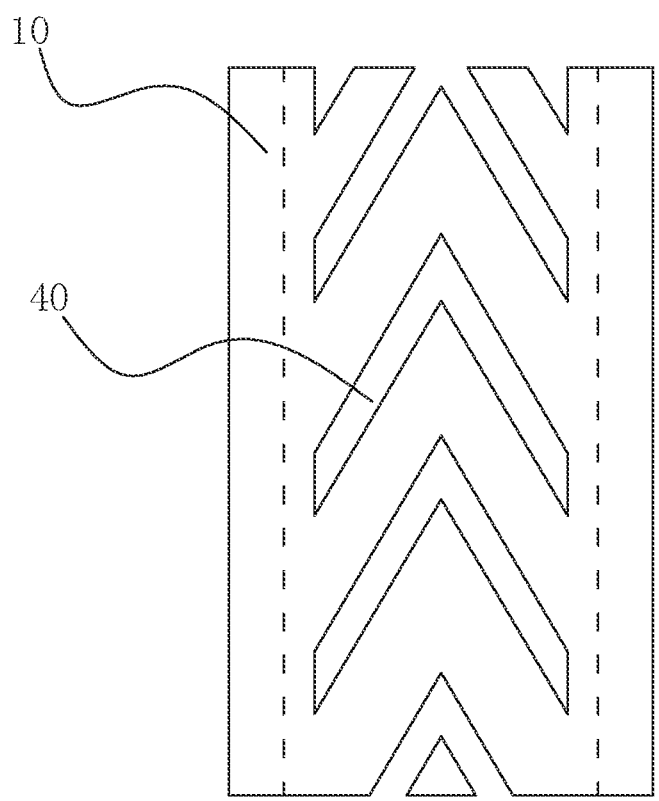
FIG. 8 is a planar view of a sixth opening structure.
Figure 9:
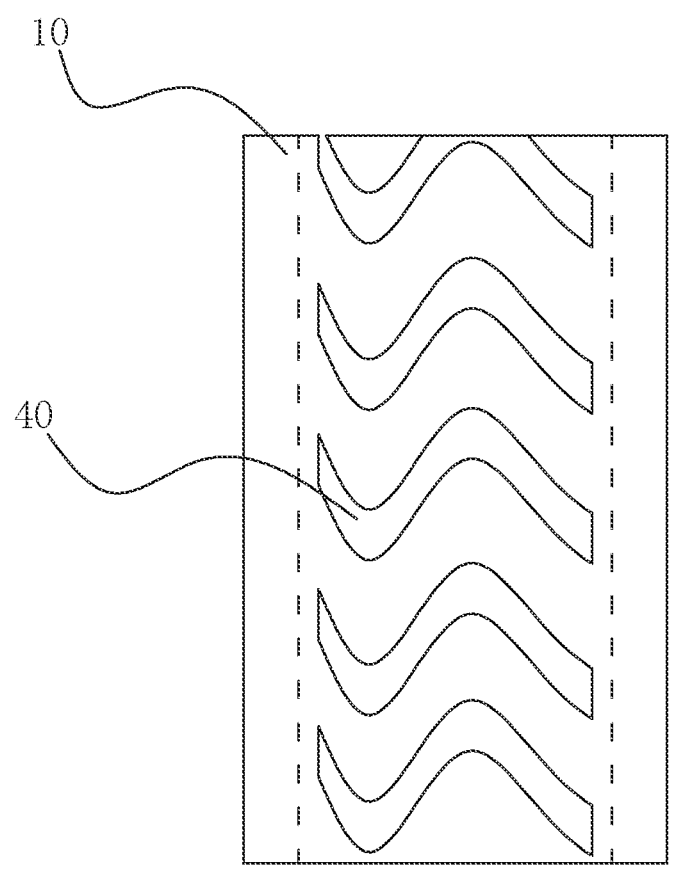
FIG. 9 is a planar view of a seventh opening structure.

Referring to FIGS. 6 to 9, FIG. 6 is a planar view of an opening according to a fourth embodiment; FIG. 7 is a planar view of an opening according to a fifth embodiment; FIG. 8 is a planar view of a sixth opening structure; FIG. 9 is a planar view of the seventh opening structure. The openings 40 of the above four structures penetrate the first membrane 10. Each support member 30 is correspondingly provided with a plurality of openings 40, and the plurality of openings 40 are arranged along the first direction. Optionally, the plurality of openings 40 are distributed at equal intervals. As a result, the compliance of the first membrane 10 can be further improved, which is determined according to the number and size of the openings 40.

Figure 2:
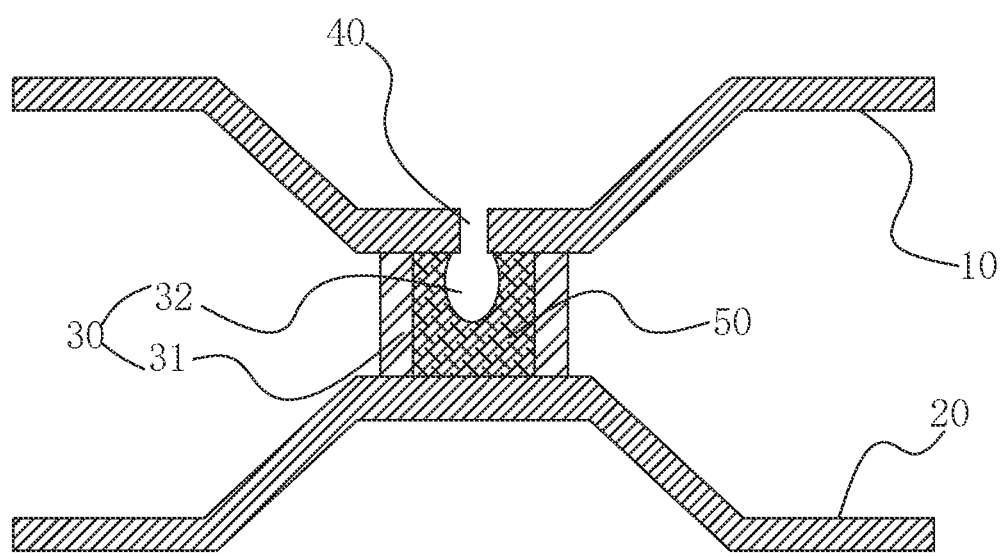
FIG. 2 is a schematic structural diagram of the opening according to the first embodiment when being filled with a filler material.

Referring to FIG. 2, FIG. 2 is a schematic structural diagram of the opening according to a first embodiment when being filled with a filler material. The opening 40 penetrates through the first membrane 10, and a part of the area in the first chamber 32 has the filler material 50. This part of the area is close to the second membrane 20. The size of the opening 40 is small, and the filler material 50 in the first chamber 32 is only partially released, so that, on the one hand, the compliance of the first membrane 10 can be increased and, on the other hand, the mechanical stress concentration on the second membrane 20 or on the interface between the second membrane 20 and the support wall 31 can be alleviated.

The support wall 31 is optionally made of silicon nitride, and the filler material 50 partially filled in the first chamber 32 is optionally silicon oxide with a dielectric constant lower than that of silicon nitride. As a result, the inter-plate capacitance between the first membrane 10 and the first membrane 10 is significantly reduced.

Optionally, the support member 30 includes a plurality of support walls 31, thereby forming a plurality of first chambers 32. Among the two adjacent first chambers 32, one of the first chambers 32 has an opening 40 provided on the first membrane 10, and the other one of the first chambers 32 has an opening 40 provided on the second membrane 20.

Figure 10:
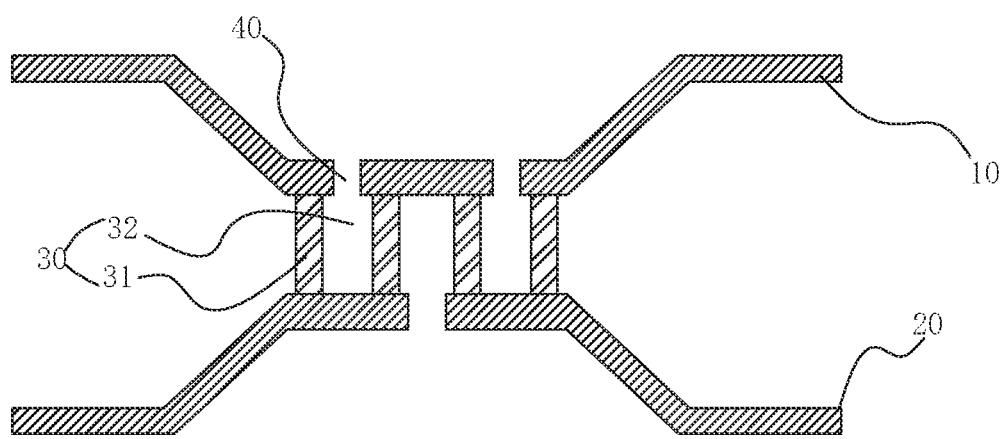
FIG. 10 is a schematic structural diagram of a first type of support member structure.

As shown in FIG. 10, FIG. 10 is a schematic structural diagram of a first support member structure. The opening 40 located on first membrane 10 and the opening 40 located on the second membrane 20 are alternately arranged and spaced from each other. Each opening 40 corresponds to a first chamber 32. The areas of the first membrane 10 and the second membrane 20 corresponding to the support member 30 form a corrugated structure, and at the same time the filler material 50 in the several first chambers 32 is released, thus the compliance of the double membrane structure can be further improved.

Figure 11:
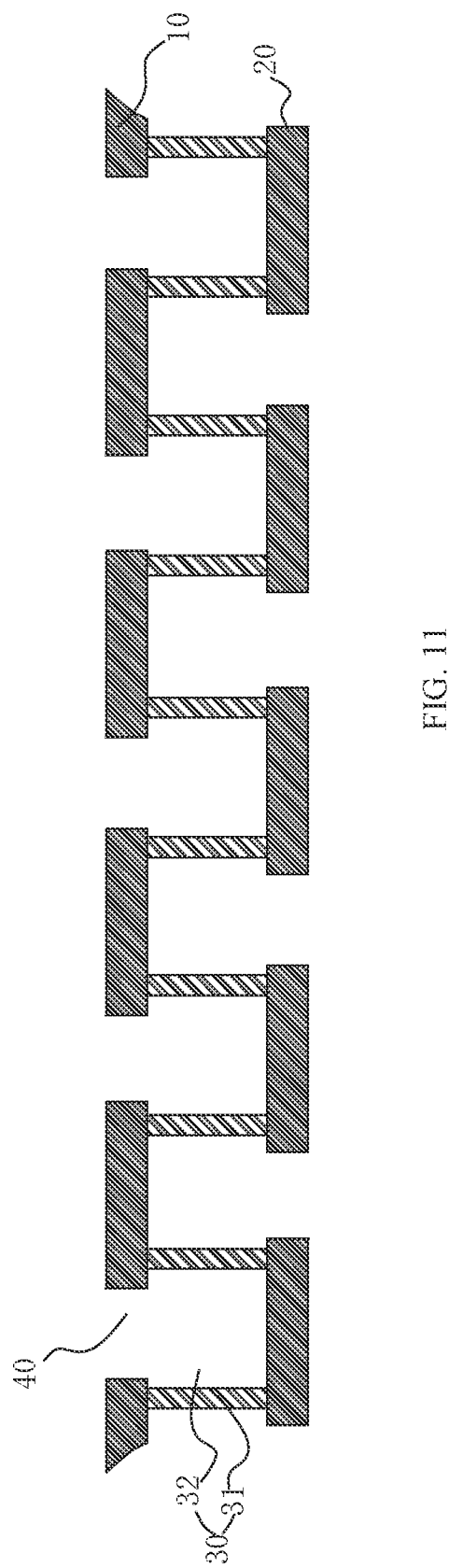
FIG. 11 is a schematic structural diagram of a second type of support member structure.

Referring to FIG. 11, FIG. 11 is a schematic structural diagram of the second support member structure. The corrugated structure formed by the support member 30 extends to the entire membrane, so that there is no seal between the first membrane 10 and the second membrane 20. Compared with the conventional membrane formed by the conventional single-layer deposition material, the first membrane 10 and the second membrane 20 has better compliance.

Figure 3:
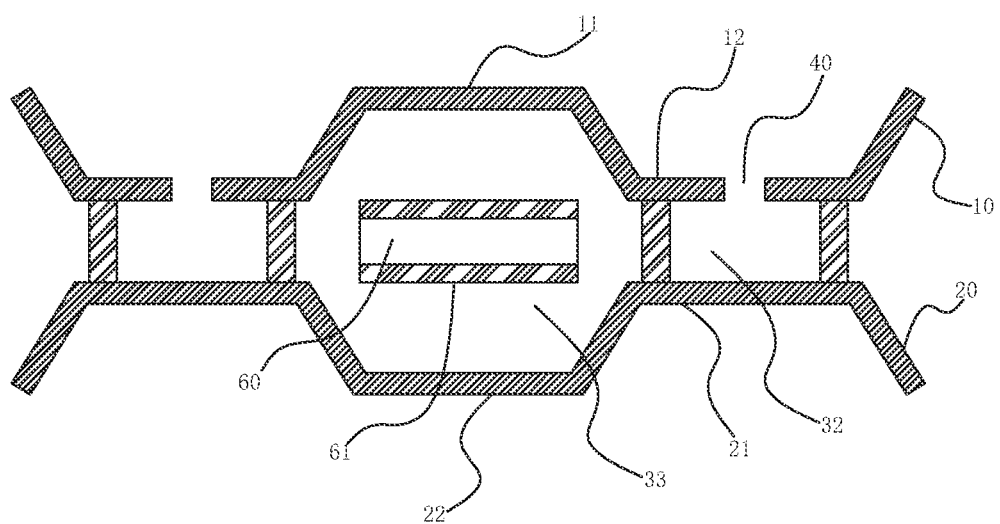
FIG. 3 is a schematic structural diagram of the opening according to the first embodiment when including a counter electrode.
Figure 12:
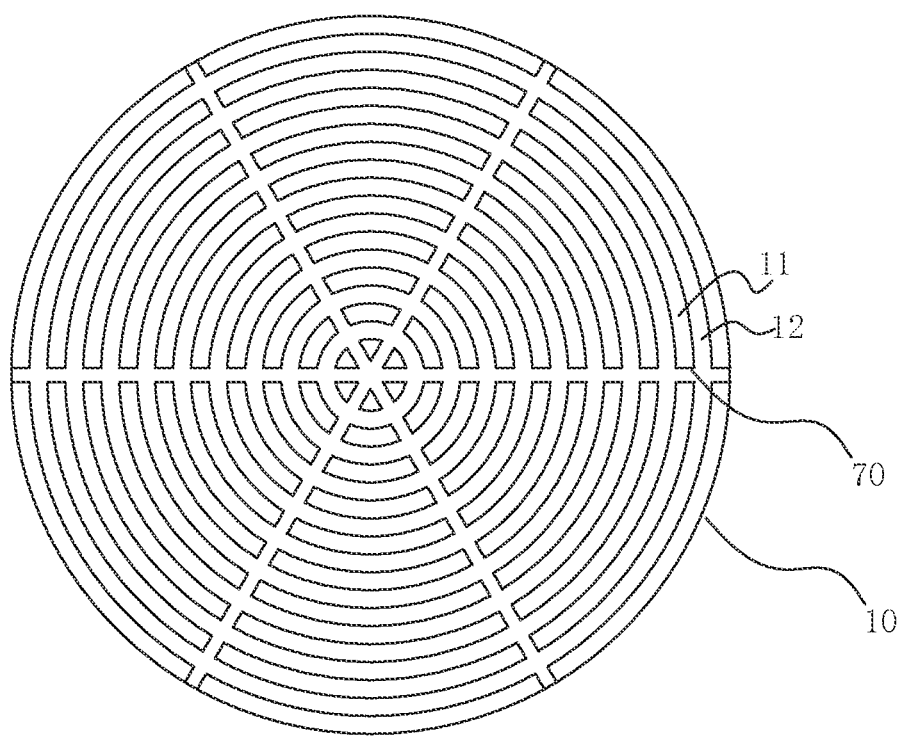
FIG. 12 is a top view of a first membrane.

Referring to FIGS. 3 and 12, FIG. 3 is a schematic structural diagram of the opening according to the first embodiment when including a counter electrode, and FIG. 12 is a top view of the first membrane. The first membrane 10 includes a plurality of first protrusions 11 and first recesses 12 alternately arranged along the second direction. The second membrane 20 includes a plurality of second recess 21 and second protrusions 22 alternately arranged in the second direction. The first protrusion 11 is opposite to the second protrusion 22, and the first recess 12 is opposite to the second recess 21.

The first protrusion 11 and the second protrusion 22 opposite to each other and the two adjacent support walls 31 enclose to form a second chamber 33. The second chamber 33 is hermetically sealed. In some embodiments, the internal pressure is less than the outside atmosphere. The internal pressure of the second chamber 33 is less than 0.2 atm, and optionally equal to 0.01 atm. In some embodiments, the second chamber 33 is vacuumed.

With continued reference to FIG. 3 and FIG. 12, a counter electrode 60 is provided in the second chamber 33. The counter electrode 60 is suspended within the second chamber 33 by spokes 70. The counter electrode 60 extends in a first direction, and the counter electrode 60 is not mechanically coupled to the support member 30. The plurality of counter electrodes 60 and the plurality of support members 30 are alternately arranged along the second direction.

The conductive member 61 is disposed on opposite upper and lower surfaces of the counter electrode 60. The first protrusion 11 is spaced from the conductive element 61 of the counter electrode 60, so that a first capacitor is formed therebetween. The second protrusion 22 is spaced from the conductive element 61 of the corresponding counter electrode 60, so that a second capacitor is formed therebetween. In response to the pressure applied to the first protrusion 11 and the second protrusion 22, the first protrusion 11 and the second protrusion 22 are movable relative to the corresponding counter electrode 60, thereby changing the distance between the first protrusion 11 and the second protrusion 22 and the corresponding counter electrodes 60 of the support member 30. As a result, the capacitance is changed accordingly to output electrical signals.

Alternatively, the counter electrode 60 includes a single conductor, so that the first capacitor is formed between the first membrane 10 and the single conductor, and the second capacitor is formed between the second membrane 20 and the single conductor.

Continuing to refer to FIG. 3, a plurality of support walls 31 are respectively sandwiched between the first recess 12 and the second recess 21 opposite to each other, and the first recess 12 and the second recess 21 are connected together by the corresponding support wall 31 of the support member 30. The support wall 31 may be integrally formed with one of the first membrane 10 and the second membrane 20. Alternatively, after the first membrane 10 and the second membrane 20 are assembled together, a support wall 31 is formed between the first recess 12 and the second recess 21.

Figure 13:
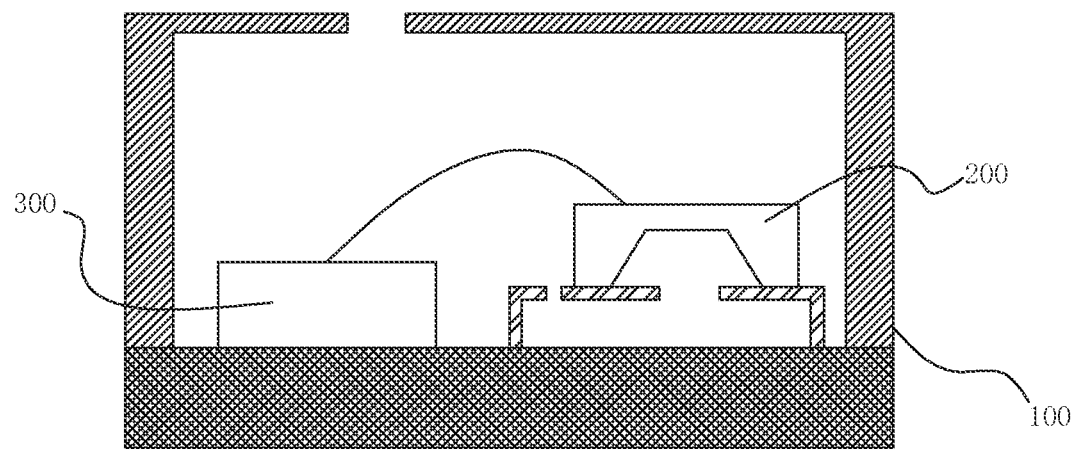
FIG. 13 is a schematic structural diagram of an electro-acoustic conversion device.

The present disclosure also provides an electro-acoustic conversion device 100, as shown in FIG. 13, including the aforementioned micro-electro-mechanical system 200 and a circuit device 300 (ASIC) electrically connected to the micro-electro-mechanical system 200. The electro-acoustic conversion device 100 may be a microphone or a speaker, etc.

The structures, features, and effects of the present disclosure are described in detail based on the embodiments shown in the drawings. The above descriptions are only some embodiments of the present disclosure, but the present disclosure does not limit the scope as shown in the drawings. Any changes made to the concept of the present disclosure, or equivalent embodiments modified into equivalent changes, which still do not exceed the spirit covered by the description and the drawings, should fall within the protection scope of the present disclosure.

What is claimed is:

1. A micro-electro-mechanical system, comprising:
a first membrane;
a second membrane arranged opposite to the first membrane;
a plurality of support members arranged between the first membrane and the second membrane, wherein each support member of the plurality of support members comprises a plurality of support walls, and opposite ends of each of the plurality of support walls are respectively connected to the first membrane and the second membrane; the first membrane, the second membrane, and two adjacent support walls in one support member are enclosed to form a first chamber; and
an opening provided on the first membrane, wherein the opening is configured to link the first chamber with the outside;
wherein the first membrane includes a plurality of first protrusions and a plurality of first recesses alternately arranged along a second direction, and the second membrane comprises a plurality of second recesses and a plurality of second protrusions alternately arranged in the second direction, each of the plurality of first protrusions is opposite to one of the plurality of second protrusions, one first protrusion, one second protrusion and corresponding two adjacent support walls together form a second chamber, a counter electrode is arranged in the second chamber and not in the first chamber, each two support members are sandwiched between one first recess and the corresponding one second recess, and the first chamber is formed by the adjacent two support members, the first recess, and the corresponding second recess.

2. The micro-electro-mechanical system as described in claim 1, wherein the opening comprises a slit-shaped hole structure, a circular hole structure, an approximate rectangular hole structure, a Chevron hole structure, or an S-shaped hole structure.

3. The micro-electro-mechanical system as described in claim 1, wherein each of the plurality of support members is provided with a plurality of openings, and the plurality of the openings are arranged at intervals along a first direction.

4. The micro-electro-mechanical system as described in claim 1, wherein the opening penetrates through the first membrane, and a partial area in the first chamber has a filler material.

5. The micro-electro-mechanical system as described in claim 4, wherein the filler material comprises silicon oxide.

6. The micro-electro-mechanical system as described in claim 1, wherein each of the plurality of support members comprises a plurality of first chambers, and among two adjacent first chambers of the plurality of first chambers, the opening of one of the two adjacent first chambers is provided on the first membrane, and the opening of the other one of the two adjacent first chambers is provided on the second membrane.

7. The micro-electro-mechanical system as described in claim 1, wherein the support wall is made of polysilicon or silicon nitride.

8. The micro-electro-mechanical system as described in claim 1, wherein an opening is provided on the second membrane, the opening is configured to link the first chamber with the outside.

* * * * *